(12) United States Patent
Maruyama (10) Patent No.: US 8,421,178 B2
(45) Date of Patent: Apr. 16, 2013

(54) SOLID-STATE IMAGING DEVICE, ELECTRONIC MODULE AND ELECTRONIC APPARATUS

(75) Inventor: Yasushi Maruyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 25 days.

(21) Appl. No.: 13/036,559

(22) Filed: Feb. 28, 2011

(65) Prior Publication Data

US 2011/0147876 A1    Jun. 23, 2011

Related U.S. Application Data

(63) Continuation of application No. 11/970,024, filed on Jan. 7, 2008, now Pat. No. 7,902,578.

(30) Foreign Application Priority Data

Jan. 11, 2007 (JP) ................................. 2007-003552

(51) Int. Cl.
*H01L 31/10* (2006.01)
(52) U.S. Cl.
USPC ........................... 257/443; 257/292; 257/682
(58) Field of Classification Search .................. 257/222, 257/225, 258, 290, 291, 292, 443, 682, 913, 257/E21.318, E21.321, E23.137, E27.133, 257/E31.097
See application file for complete search history.

(56) References Cited

U.S. PATENT DOCUMENTS

| | | | |
|---|---|---|---|
| 6,670,258 B2* | 12/2003 | Carlson et al. | 438/471 |
| 7,067,392 B2* | 6/2006 | Yamazaki et al. | 438/455 |
| 7,364,932 B2* | 4/2008 | Ikushima et al. | 438/53 |
| 7,452,742 B2* | 11/2008 | Kanbe | 438/57 |
| 7,470,944 B2* | 12/2008 | Ishida et al. | 257/292 |
| 7,633,104 B2* | 12/2009 | Lim | 257/291 |
| 2003/0209712 A1* | 11/2003 | Fujita et al. | 257/72 |
| 2005/0139828 A1* | 6/2005 | Maruyama et al. | 257/59 |
| 2005/0179053 A1* | 8/2005 | Ezaki et al. | 257/189 |
| 2006/0197007 A1* | 9/2006 | Iwabuchi et al. | 250/208.1 |
| 2006/0281215 A1* | 12/2006 | Maruyama et al. | 438/57 |

FOREIGN PATENT DOCUMENTS

JP    2007-003552    1/2007

* cited by examiner

*Primary Examiner* — Long Tran
*Assistant Examiner* — Jordan Klein
(74) *Attorney, Agent, or Firm* — SNR Denton US LLP (57) ABSTRACT

A solid-state imaging device including an imaging area formed of a plurality of pixels arrayed in a two-dimensional matrix is provided. The solid-state imaging device includes: a photoelectric conversion portion including a charge accumulation region provided on a semiconductor substrate; a read transistor for reading electric charges from the photoelectric conversion portion; and a gettering site for separating metal impurities within the semiconductor substrate from at least the photoelectric conversion portion. The photoelectric conversion portion is provided on the surface side of the semiconductor substrate, and the gettering site is provided on the rear side away from the semiconductor substrate.

10 Claims, 6 Drawing Sheets

*FIG. 6*

SOLID-STATE IMAGING DEVICE, ELECTRONIC MODULE AND ELECTRONIC APPARATUS

RELATED APPLICATION DATA

This application is a continuation of U.S. patent application Ser. No. 11/970,024, filed Jan. 7, 2008, the entirety of which is incorporated herein by reference to the extent permitted by law. The present application claims the benefit of priority to Japanese Patent Application No. 2007-003552 filed in the Japanese Patent Office on Jan. 11, 2007, the entirety of which is incorporated by reference herein to the extent permitted by law.

BACKGROUND OF THE INVENTION

1. Field of the Invention

The present invention relates to a solid-state imaging device, and an electronic module and an electronic apparatus including the solid-state imaging device.

2. Description of the Related Art

A solid-state imaging device including a large number of pixels arrayed in a two-dimensional matrix has been widely known. Each pixel has photo-electric conversion elements including a photodiode.

A CMOS (Complementary Metal-Oxide-Semiconductor) solid-state imaging device and a CCD (Charge-Coupled Device) solid-state imaging device are such solid-state imaging devices having respective read and transfer methods.

In particular, CMOS solid-state imaging devices with excellent characteristics have been developed in accordance with a recent progress of semiconductor manufacturing process and have attracted an attention.

Figure 1:
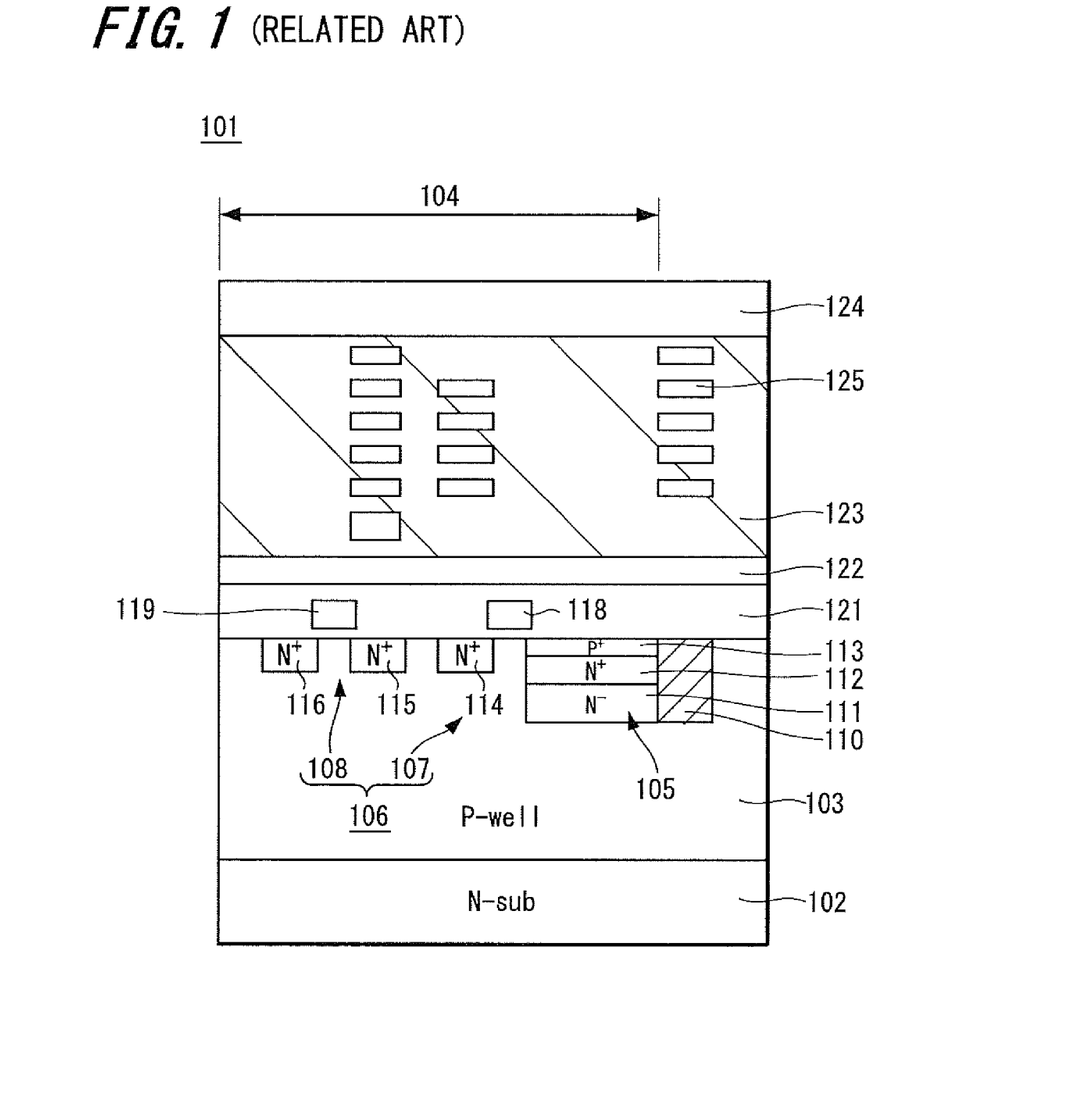
FIG. 1 is a schematic cross-sectional view showing an arrangement of a solid-state imaging device according to the related art.

FIG. 1 is a schematic diagram showing an arrangement of a CMOS solid-state imaging device according to the related art. As shown in FIG. 1, a CMOS solid-state imaging device 101 includes a first conductivity type, for example, N-type silicon semiconductor substrate 102 on which a second conductivity type, that is, P type semiconductor well region 103 is formed. The P-type semiconductor well region 103 includes a photodiode 105 serving as a photo-electric conversion element and a MOS transistor group 106 formed of a plurality of MOS transistors in a unit pixel area divided by a pixel separating area 110.

The photodiode 105 is formed of an N-type semiconductor area surrounded by the pixel separating area 110 and the P-type semiconductor well region 103. Specifically, the photodiode 105 is formed of a low-impurity concentration N-type semiconductor region (N semiconductor region) 111 located deep from the surface and a high-impurity concentration N-type semiconductor region (N$^+$ semiconductor region) 112 located at the surface side. Further, a P$^+$ accumulation layer 113 formed of a high-impurity concentration P-type semiconductor region is formed on an interface at the surface side of the N$^+$ semiconductor region 112 so as to suppress occurrence of a dark current. The photodiode 105 is configured as a HAD (Hole Accumulation Diode) sensor.

The MOS transistor group 106 includes a read transistor 107 connected to the photodiode and other MOS transistors 108.

The read transistor 107 is formed of an N$^+$ source/drain region 114 formed in the P-type semiconductor well region 103, the N$^+$ semiconductor region 112 of the photodiode 105 and a gate electrode 118 formed on a substrate surface between the N$^+$ source/drain region 114 and the photodiode 105 through a gate insulated film.

The other MOS transistors 108 are formed of the N$^+$ source/drain regions 115 and 116 formed in the P-type semiconductor well region 103 and a gate electrode 119 formed on the substrate surface between the N$^+$ source/drain regions 115 and 116 through a gate insulated film. When including four MOS transistors, a read transistor, a reset transistor, an amplification transistor and a vertical selection transistor are arranged, for example. Further, multilayer wiring layers 125 is formed on the substrate surface through an insulating interlayer 123. Also, a color filter and an on-chip lens (not shown) and so on are formed.

Light incident on the photodiode 105 is applied from the substrate surface side on which the MOS transistors for accumulating and reading signal charge are formed. Such surface-illuminated CMOS solid-state imaging device 101 includes an antireflective film to increase the efficiency of focusing to the photodiode 105 on the substrate surface side. The surface-illuminated CMOS solid-state imaging device 101 typically includes four or more silicon oxide (SiO) films and silicon nitride (SiN) films forming a protective film to prevent the photodiode, the MOS transistor group and a wiring layer from being deteriorated with age and an insulating interlayer formed under the protective film on the photodiode 105.

Upon manufacturing such solid-state imaging device, if impurities such as metals, in particular, heavy metals are mixed into the semiconductor substrate, quality and characteristics of the manufactured semiconductor device may be deteriorated greatly.

Impurities may be mixed into the semiconductor substrate when water and various gases used in the process of manufacturing the semiconductor substrate contain impurities, or may be generated from members constituting an apparatus used in the process. It is difficult to completely eliminate such impurities and therefore it is difficult to manufacture a semiconductor substrate without impurities.

Therefore, "gettering" is carried out so as to remove impurities from the semiconductor substrate in the vicinity of the surface. Specifically, a gettering site having a function of capturing and fixing impurities mixed into the semiconductor substrate is formed within the semiconductor substrate and the gettering site captures and fixes impurities in the vicinity of the surface of the semiconductor substrate (see Japanese Unexamined Patent Application Publication No. 2006-93175, for example).

An intrinsic gettering (IG) of forming a gettering site as a layer within a semiconductor substrate and an extrinsic gettering (EG) of forming a gettering site at the rear surface of a semiconductor substrate are given as examples of such gettering.

However, the related-art arrangement having such gettering site alone is not sufficient in terms of gettering ability to capture and fix impurities. Also, there may be a risk that impurities once captured by the gettering site be drained later from the gettering site to the photodiode, and so a probability of generating a white spot may increase.

SUMMARY OF THE INVENTION

It is desirable to provide a solid-state imaging device including a gettering site having high gettering ability for impurities, an electronic module and an electronic apparatus including the solid-state imaging device.

According to an embodiment of the present invention, there is provided a solid-state imaging device. The solid-state imaging device includes an imaging area formed of a plurality of pixels arrayed in a two-dimensional matrix. The solid-state imaging device includes a photoelectric conversion portion including a charge accumulation region provided on a semiconductor substrate; a read transistor for reading electric charges from the photoelectric conversion portion; and a gettering site for separating metal impurities within the semiconductor substrate from at least the photoelectric conversion portion. The photoelectric conversion portion is provided on the surface side of the semiconductor substrate, and the gettering site is provided on the rear side away from the semiconductor substrate.

According to another embodiment of the present invention, there is provided an electronic module. The module includes a solid-state imaging device including an imaging area formed of a plurality of pixels arrayed in a two-dimensional matrix. The solid-state imaging device includes a photoelectric conversion portion including a charge accumulation region provided on a semiconductor substrate; a read transistor for reading electric charges from the photoelectric conversion portion; and a gettering site for separating metal impurities within the semiconductor substrate from at least the photoelectric conversion portion. The photoelectric conversion portion is provided on the surface side of the semiconductor substrate, and the gettering site is provided on the rear side away from the semiconductor substrate.

According to further embodiment of the present invention, there is provided an electronic apparatus. The apparatus includes a solid-state imaging device including an imaging area formed of a plurality of pixels arrayed in a two-dimensional matrix. The solid-state imaging device includes a photoelectric conversion portion including a charge accumulation region provided on a semiconductor substrate; a read transistor for reading electric charges from the photoelectric conversion portion; and a gettering site for separating metal impurities within the semiconductor substrate from at least the photoelectric conversion portion. The photoelectric conversion portion is provided on the surface side of the semiconductor substrate, and the gettering site is provided on the rear side away from the semiconductor substrate.

According to the embodiment of the solid-state imaging device, the photoelectric conversion portion is provided on the surface side of the semiconductor substrate and the gettering site for separating metal impurities within the semiconductor substrate from the photoelectric conversion portion is provided on the rear side away from the semiconductor substrate. Accordingly, light incident on the photoelectric conversion portion can be prevented from being affected by the gettering site and a probability of generating a white spot can be reduced.

According to the embodiment of the electronic module, the solid-state imaging device constituting the electronic module includes the photoelectric conversion portion provided on the surface side of the semiconductor substrate, and the gettering site, for separating the metal impurities within the semiconductor substrate from the photoelectric conversion portion, provided on the rear side away from the semiconductor substrate. Accordingly, the electronic module having excellent characteristics can be obtained.

According to the embodiment of electronic apparatus, the solid-state imaging device constituting the electronic apparatus includes the photoelectric conversion portion provided on the surface side of the semiconductor substrate, and the gettering site, for separating the metal impurities within the semiconductor substrate from the photoelectric conversion portion, provided on the rear side away from the semiconductor substrate. Accordingly, the electronic apparatus having excellent characteristics can be obtained.

DESCRIPTION OF THE PREFERRED EMBODIMENTS

Embodiments of the present invention will be described below with reference to the drawings.

An embodiment of the present invention is applied to, for example, a back-illuminated CMOS solid-state imaging device in which a photoelectric conversion portion is illuminated with light from the rear surface side (opposite the wiring portion).

Figure 2A:
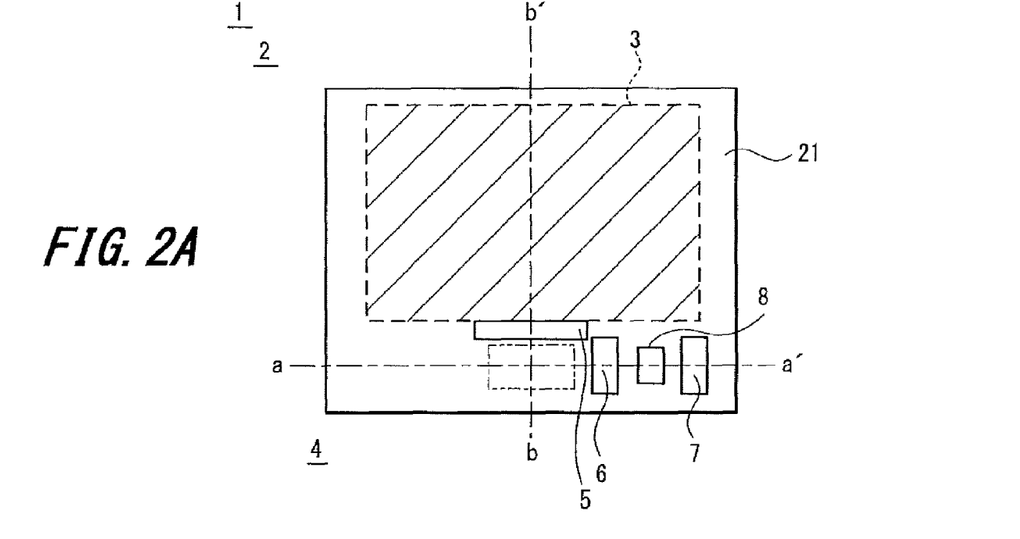
FIG. 2A is a top view showing a schematic arrangement of a pixel in a solid-state imaging device according to an embodiment of the present invention.

FIG. 2A is a top view showing one of pixels 2 which are arrayed in a two-dimensional matrix to constitute an imaging area. FIG. 2A exposes a semiconductor substrate 21 and shows the solid state imaging device 1 from the rear side for the convenience of explanation.

As shown in FIG. 2A, the pixel 2 in the solid-state imaging device 1 includes a photoelectric conversion portion 3 having a charge accumulation region and a wiring portion 4 including a read transistor for reading electric charges from the photoelectric conversion portion 3. In this embodiment, the wiring portion 4 includes a read transistor 5, a reset transistor 6 and an amplification transistor 7 as schematically shown as gate electrodes in FIG. 2A.

Figure 2B:
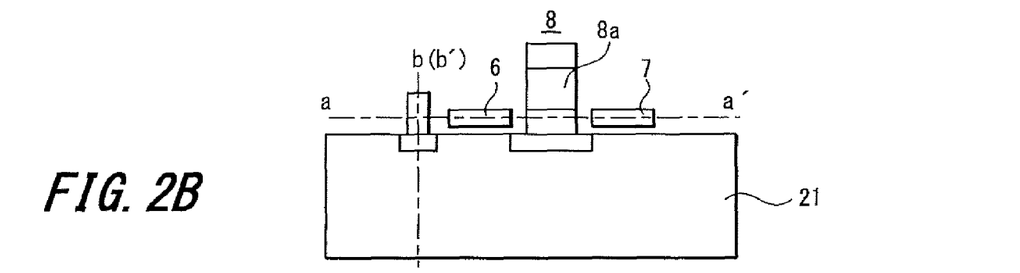
FIG. 2B is a cross-sectional view on the plane a-a' shown in FIG. 2A.

FIG. 2B shows a cross-sectional view on the plane a-a' shown in FIG. 2A.

According to the solid-state imaging device 1 of this embodiment, a photodiode constituting a main portion of the photoelectric conversion portion 3 is provided on the surface side (as shown with a broken line in FIG. 2A) of the semiconductor substrate (silicon layer) 21. The gate electrode 5 of the read transistor, the gate electrode 6 of the reset transistor and the gate electrode 7 of the amplification transistor constituting the wiring portion 4 are provided on the rear side (as shown with a solid line in FIG. 2A) of the semiconductor substrate 21. Specifically, the solid-state imaging device 1 according to the embodiment of the present invention is a back-illuminated solid-state imaging device.

In addition, according to the embodiment of the present invention, the solid-state imaging device 1 further includes a gettering stacked portion 8, which is, for example, formed by epitaxial growth and ion implantation as later described, on the rear side similarly to the gate electrodes 5 to 7 of the respective transistors.

The gettering stacked portion 8 according to the embodiment includes within the semiconductor substrate (silicon layer) 21 a gettering site 8a containing carbon, or carbon and phosphorous as later described.

The position of the gettering site 8a may preferably be selected to have a distance of 0.2 μm or more, if possible, 0.3 μm or more as a sum of a depth (vertical distance) and a shift amount (horizontal distance) from the photoelectric conversion portion 3. If the gettering site 8a is located away from the photoelectric conversion portion 3 as described above, then gettered impurities can reliably be prevented from entering the photoelectric conversion portion 3 and a probability of white spot can be decreased. Here, the gettering stacked portion 8 may preferably have a height of 1 μm or less from the semiconductor substrate (silicon layer) 21 so that the wiring layer and the like be formed with ease in the later-described manufacturing process. Therefore, it is particularly preferable that the position of the gettering site 8a be selected in consideration of the height.

In addition, it is preferable that a bias voltage be applied to the gettering stacked portion 8, with the result that the occurrence of a dark current be suppressed.

Figure 2C:
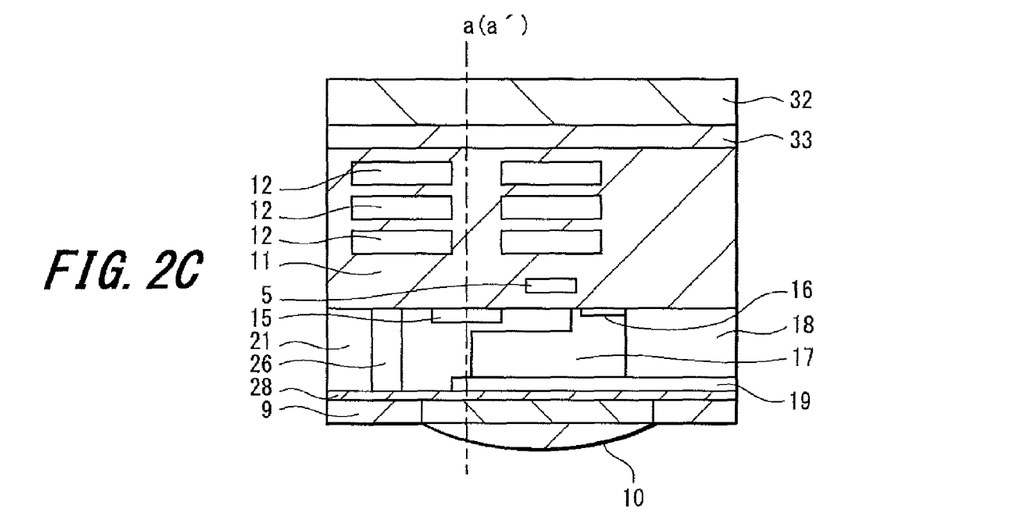
FIG. 2C is a cross-sectional view on the plane b-b' shown in FIG. 2A.

FIG. 2C shows a cross-sectional view on the plane b-b' in FIG. 2A.

The solid-state imaging device 1 according to the embodiment of the present invention includes, on the plane b-b' not including the gettering stacked portion 8, a plurality of wiring layers 12 provided in the insulating interlayer 11, a semiconductor substrate (silicon layer) 21 including P-type and N-type impurity regions, an antireflective film 28, a color filter 9 and an on-chip lens 10, in this order from the surface side (from the upper side in FIG. 2C).

A thin insulating film (not shown) serving as a gate insulated film is formed between the insulating interlayer 11 and the semiconductor substrate 21, and the gate electrode 5 to read electric charges is provided on the surface side of the insulating film.

A thick N-type region 17 constituting the photodiode of the photoelectric conversion portion 3 is formed within the semiconductor substrate (silicon layer) 21 in the thickness direction and a positive electric charge accumulation region ($P^+$ region) 16 is formed on the surface side of the N-type region 17. Also, an N-type floating diffusion (FD) 15 is formed through the read region under the gate electrode 5.

The gate electrode 5, the end portion of the N-type region 17 and the floating diffusion 15 constitute a read transistor. Upon operation, the gate electrode 5 is turned ON to read electric charges $e^-$ to the floating diffusion 15.

According to the embodiment, since the solid-state imaging device 1 is the back-illuminated solid-state imaging device, the wiring layer 12 is not located between the on-chip lens 10 and the semiconductor substrate (silicon layer) 21 and also, the gettering stacked layer 8 is provided on the same side as the wiring layer 12.

Accordingly, although the solid-state imaging device 1 according to the embodiment includes the gettering site 8a, incident light can be prevented from being shaded and hence, an amount of incident light may increase. In addition, the area of the photoelectric conversion portion 3 can be increased, the pattern shape of the N-type region can be set so that light is easily incident on the solid-state imaging device 1, and sensitivity of the solid-state imaging device 1 can be increased. Further, shading in the peripheral pixels can be suppressed.

Also, the solid-state imaging device 1 according to the embodiment includes a $P^+$ region (high-concentration P-type region) 18 formed as a pixel separating region in the whole depth direction between the N-type regions 17 of adjacent pixels. Hence, the N-type regions 17 of the respective pixels can be electrically separated from each other and electric color mixture in the adjacent pixels can be prevented.

Further, the solid-state imaging device 1 according to the embodiment also includes a $P^+$ region 19 formed on the rear side of the N-type region 17, that is, on the side of the color filter 9. Hence, a dark current caused by the interface state density can also be decreased.

Next, an example of a method of manufacturing a solid-state imaging device according to an embodiment of the present invention will be described.

Figure 3A:
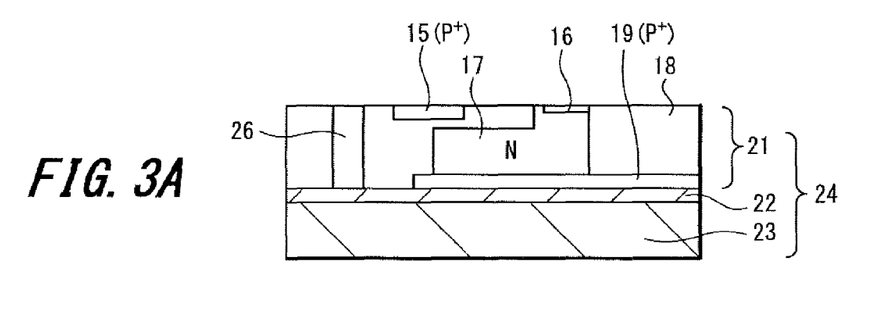
FIGS. 3A to 3C are process diagrams provided for explaining an example of a manufacturing method of a solid-state imaging device according to an embodiment of the present invention.

First, as shown in FIG. 3A, there is prepared a SOI substrate 24 including the silicon layer 21 having a predetermined thickness formed on the surface side of a silicon substrate 23 through a $SiO_2$ intermediate layer 22.

The N-type region 17 forming the photodiode, the $P^+$ region 19 at the rear side, the $P^+$ region 16 at the surface side and N-type region which becomes the floating diffusion 15 are respectively formed within the silicon layer 21 in the SOI substrate 24 by ion implantation. In addition, an alignment mark 26 for aligning the color filter and the on-chip lens is formed. Note that, since a pattern of the upper portion of the N-type region 17 is different from that of the lower portion thereof, ion implantation is carried out twice to separately form the lower portion and the upper portion.

Here, if the thickness of the silicon layer 21 is 5 μm or less, then ion implantation can be carried out using a photoresist (not shown) as a mask. If the thickness of the silicon layer 21 is more than 5 μm, then ion implantation may need to be carried out at relatively high energy using a hard mask such as an oxide film.

Figure 4A:
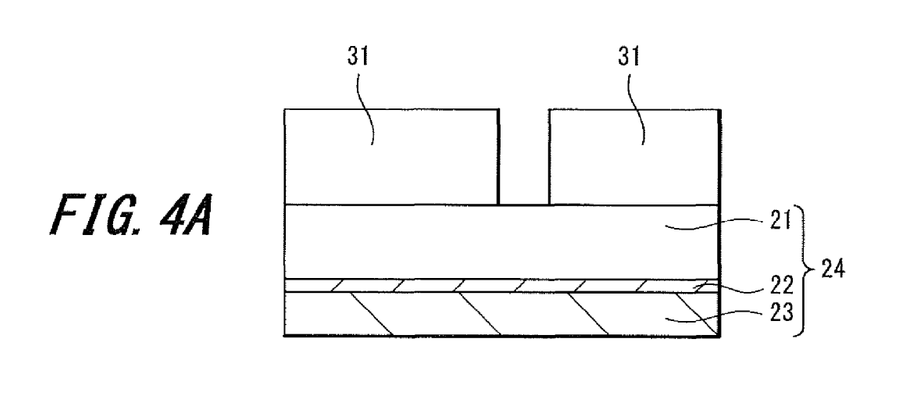
FIGS. 4A to 4C are process diagrams provided for explaining an example of a manufacturing method of a solid-state imaging device according to an embodiment of the present invention.

As shown in FIG. 4A, a cap film 31 is formed. Then, an opening is formed at a portion (see FIG. 2B) where the gettering stacked portion 8 is finally formed, and subsequently the gettering stacked portion 8 is formed by epitaxial growth.

Figure 4B:
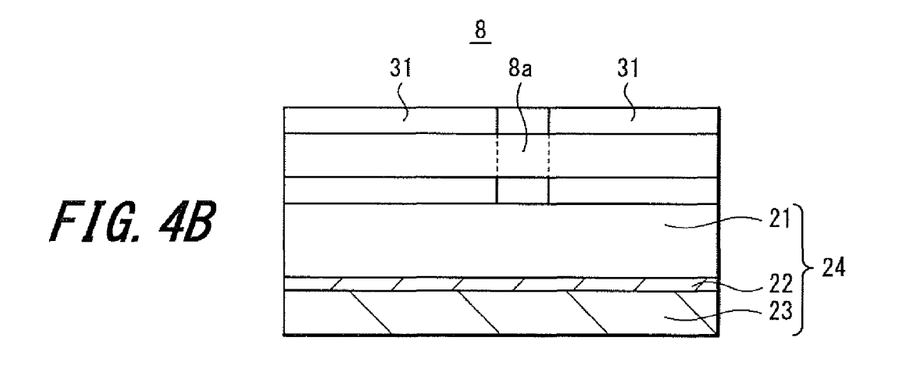

Subsequently, the gettering site 8a is formed within the gettering stacked portion 8 by implanting ions of carbon or ions of carbon and phosphorous into a predetermined depth of the gettering stacked portion 8 and the cap film 31 by ion implantation as shown in FIG. 4B.

Figure 4C:
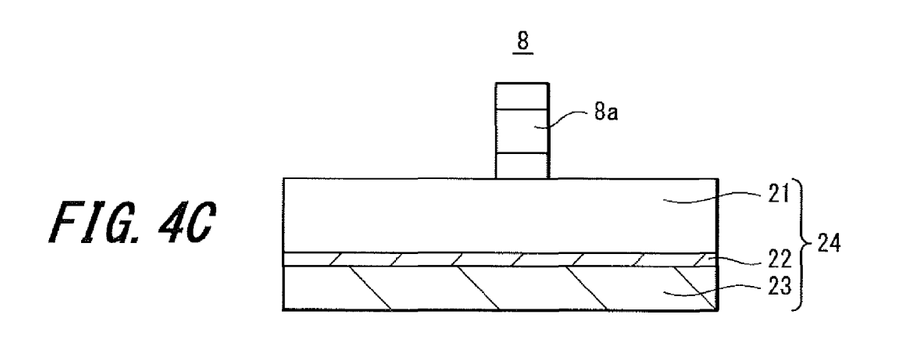

Subsequently, the cap film 31 is removed as shown in FIG. 4C.

Figure 3B:
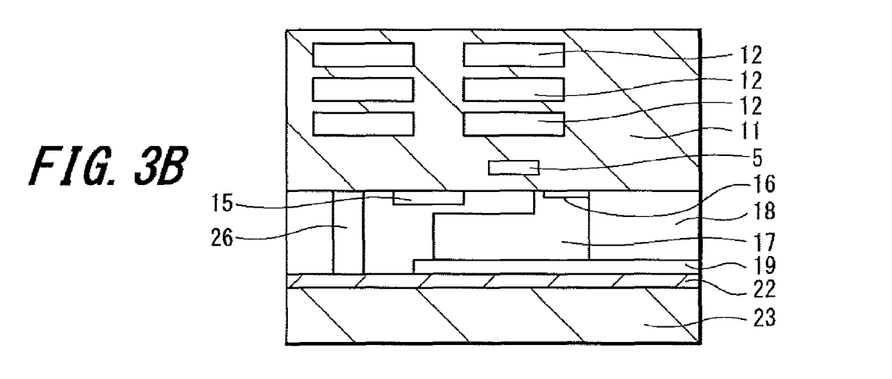

The gettering stacked portion 8 is formed as described above, and subsequently as shown in FIG. 3B, the wiring portion 4 in which the multilayer wiring layers 12 are formed through the insulating interlayer 11 is formed on the whole surface of the silicon layer 21. Further, a protective film is formed on the top surface of the wiring portion 4 although not shown. The protective film is used to prevent the wiring portion 4 from adsorbing moisture so that the wiring layers 12 is prevented from being affected. A silicon nitride film, for example, is formed as the protective film by plasma CVD.

Figure 3C:
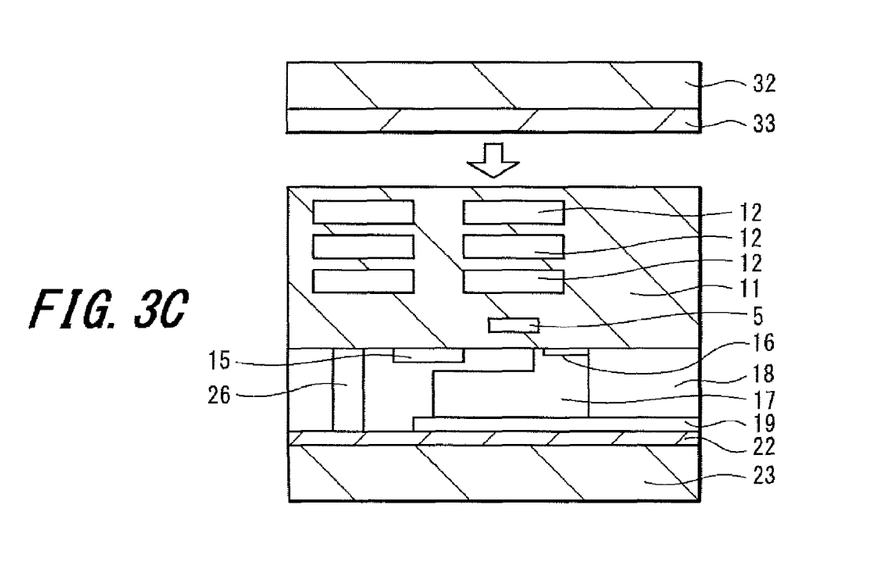

Subsequently, as shown in FIG. 3C, a support substrate 32 is prepared and a bonding layer 33 is formed on one surface of the support substrate 32. The support substrate 32 is bonded to the insulating interlayer 11 including the wiring layers 12 through the bonding layer 33 by annealing at a temperature of 400° C. or less. Since the wiring layers 12 have been formed already, the annealing is carried out at a low temperature of 400° C. or less so as not to affect the wiring layers 12. SOG (spin on glass) or metal layers, which can be metal-bonded, may be used as the bonding layer 33 in that case.

Figure 5A:
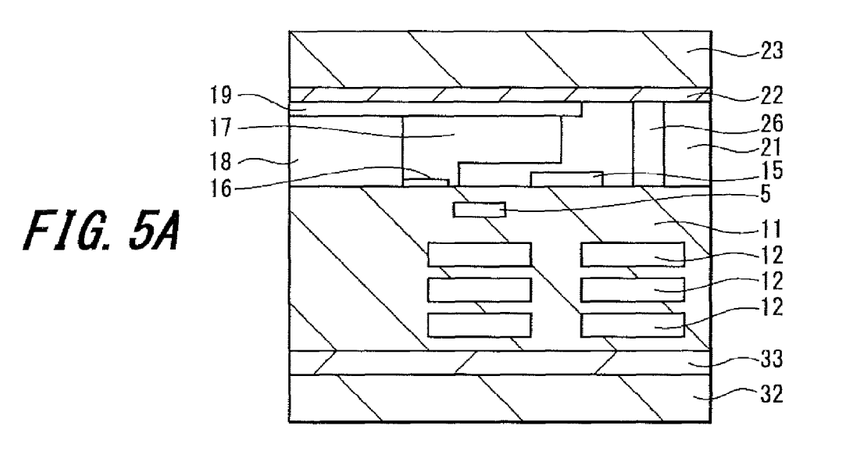
FIGS. 5A to 5C are process diagrams provided for explaining an example of a manufacturing method of a solid-state imaging device according to an embodiment of the present invention.
Figure 5B:
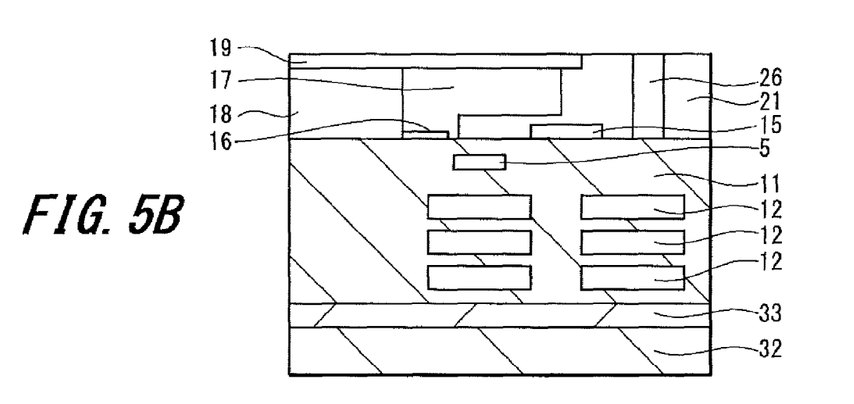

Subsequently, as shown in FIG. 5A, a wafer is inverted and the rear side is etched by rear grind, CMP (chemical mechanical polish), wet etching or the like to remove the silicon substrate 23 and the intermediate layer ($SiO_2$ film) 22 from the SOI substrate 24, thereby exposing the silicon layer 21 as shown in FIG. 5B.

Subsequently, the top surface of the silicon layer 21 is oxidized to form an oxide film.

Figure 5C:
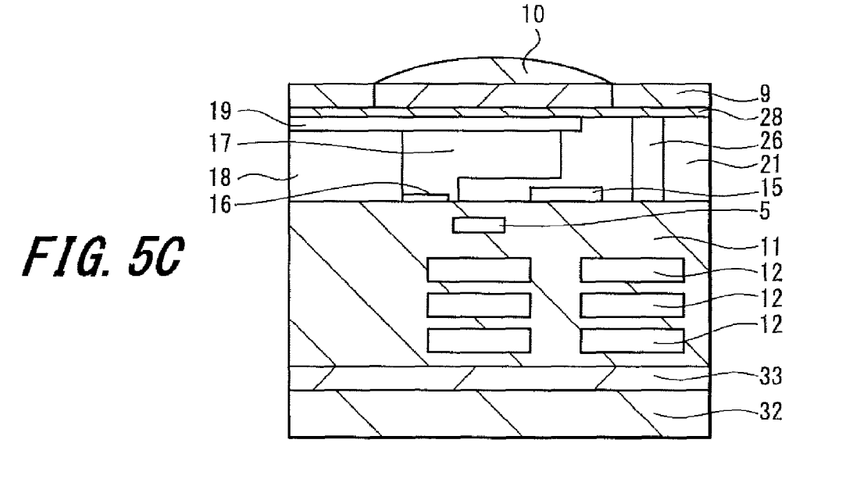

Afterward, as shown in FIG. 5C, the antireflective film 28 is formed on the silicon layer 21 and the color filter 9 and the on-chip lens 10 are sequentially formed on the antireflective film 28. In addition, pad electrodes for use in connecting external terminals are formed, although not shown.

As described above, the back-illuminated solid-state imaging device 1 according to the embodiment of the present invention is manufactured.

Next, an electronic module and an electronic apparatus according to embodiments of the present invention will be described.

Figure 6:
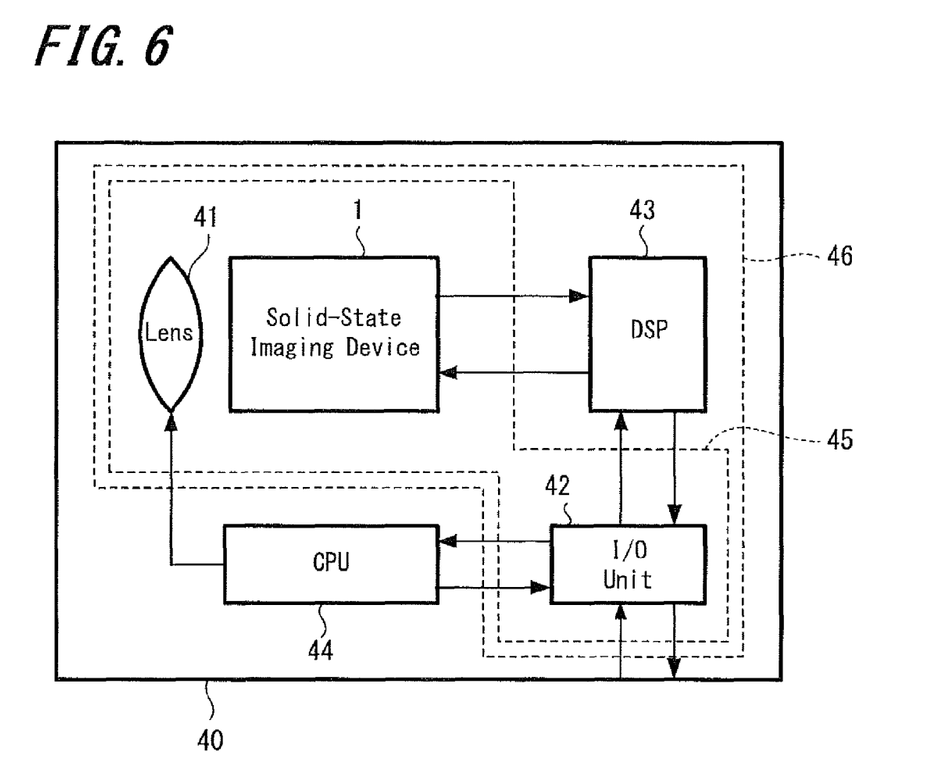
FIG. 6 is a schematic diagram showing an example of arrangement of an electronic module and an electronic apparatus according to an embodiment of the present invention.

FIG. 6 is a schematic diagram showing the configuration of an electronic module and an electronic apparatus according to the embodiments of the present invention.

As shown in FIG. 6, an electronic apparatus (for example, camera) according to the embodiment of the present invention includes the solid-state imaging device 1, an optical lens system 41, an I/O (input-output) unit 42, a signal processor (Digital Signal Processor) 43 and a central processing unit (CPU) 44 for controlling the optical lens system 41. It should be noted that an electronic module (for example, camera module) 45 can be constructed including the solid-state imaging device 1, the optical lens system 41 and the I/O portion 42 alone. Alternatively, an electronic module (for example, camera module) 46 can be constructed including the solid-state imaging device 1, the optical lens system 41, the I/O unit 42 and the signal processor (Digital Signal Processor) 43 alone.

As described in the above embodiments of the present invention, according to the solid-state imaging device of the embodiments, the photoelectric conversion portion is provided on the surface side of the semiconductor substrate and the gettering site for isolating the metal impurities within the semiconductor substrate from the photoelectric conversion portion is provided on the rear side away from the semiconductor substrate. Accordingly, light incident on the photoelectric conversion portion can be prevented from being affected by the gettering site and the probability of white spot can be decreased.

Also, according to the electronic module of the embodiment, the solid-state imaging device constituting the electronic module includes the photoelectric conversion portion provided on the surface side of the semiconductor substrate and the gettering site, for isolating metal impurities within the semiconductor substrate from the photoelectric conversion portion, provided on the rear side away from the semiconductor substrate. Accordingly, the electronic module with excellent characteristics can be obtained.

Also, according to the electronic apparatus of the embodiment, the solid-state imaging device constituting the electronic apparatus includes the photoelectric conversion portion provided on the surface side of the semiconductor substrate and the gettering site, for isolating the metal impurities within the semiconductor substrate from the photoelectric conversion portion, provided on the rear side away from the semiconductor substrate. Accordingly, the electronic apparatus with excellent characteristics can be obtained.

Further, in the back-illuminated CMOS solid-state imaging device according to the related art, if the gettering site is provided on the light incident side, then incident light will be shaded and there is a risk that characteristics will be deteriorated. However, the solid-state imaging device according to the embodiment of the present invention can suppress the shading of incident light due to the gettering site. Therefore, according to the embodiment of the present invention, in particular, an excellent back-illuminated solid-state imaging device can be obtained.

In addition, according to the back-illuminated CMOS solid-state imaging device, it is possible to prevent incident light from being shaded by an obstacle such as a wiring layer, as in a surface-illuminated apparatus. Accordingly, in the solid-state imaging device of the embodiment of the present invention, not only incident light can be prevented from being shaded by the gettering site but also sensitivity can be improved and shading can be suppressed.

Specifically, according to the above-mentioned back-illuminated CMOS solid-state imaging device, since light can be prevented from being affected by the obstacle such as the wiring layer, it is possible to improve sensitivity by increasing an effective numerical aperture.

Also, even when the wiring layer is formed on the photoelectric conversion portion, incident light can be prevented from being shaded so that freedom of design of the wiring layer can be increased. Thus, the wiring layer is formed of a multilayer to reduce the area of the pixel so that an integration degree of an element can be increased.

Also, although not shown, in the solid-state imaging device according to the embodiment of the present invention, it is preferable that the gettering stacked portion 8 be provided not in the inside of but at the outer peripheral portion of the imaging area in which a plurality of pixels are arrayed in a two-dimensional matrix.

Accordingly, as compared with the case in which the gettering stacked portion is provided in the inside (for example, in a separated area of each pixel) of the imaging area, a portion of the area occupied by the gettering stacked portion 8 can be reduced in each pixel so that the pixel can be miniaturized.

It should be noted that numerical conditions such as materials used, the amounts thereof, process time and dimensions described in the above-mentioned embodiments are preferable examples and that dimensions, shapes, and layout relationships in the respective drawings used in the description also are schematic ones. That is, the present invention is not limited to those embodiments. For example, a P-type semiconductor can be replaced with an N-type semiconductor and an N-type semiconductor can be replaced with a P-type semiconductor in the present invention.

For example, there has been described an example in which the wiring layers 12 are formed after the gettering stacked portion 8 was formed. However, the wiring layers 12 and the insulating interlayer 11 may have been formed in advance, and the gettering stacked portion 8 may be formed after the opening was formed at the predetermined portion of the insulating interlayer 11.

Also, although not explained and shown in the example of manufacturing method according to the above-described embodiments of the present invention, the present invention can be variously changed and modified. For example, a semiconductor region (for example, a semiconductor region constituting a transistor, etc.) of a peripheral circuit portion, wires and so on may be simultaneously formed, when the semiconductor region that constitutes the photoelectric conversion portion is formed.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device including an imaging area with a plurality of pixels, said device comprising:
   a semiconductor substrate with oppositely facing first and second surface sides;
   a photoelectric conversion portion in the semiconductor substrate and within an imaging area of the semiconductor substrate;
   a read transistor for reading electric charges from the photoelectric conversion portion;
   an insulating interlayer on the semiconductor substrate; and
   a site separating impurities that are within the semiconductor substrate from the photoelectric conversion portion,
   wherein,
      the photoelectric conversion portion is provided at least in part at the first surface side of the semiconductor substrate,
      the site is a part of a stacked structure that extends from the second surface side of the semiconductor substrate into the insulating interlayer, and
      incident light enters into said photoelectric conversion portion via said first surface side.

2. The solid-state imaging device according to claim 1, wherein the read transistor is provided on the second surface side of the semiconductor substrate.

3. The solid-state imaging device according to claim 1, wherein the site is deposited by epitaxial growth on the second surface side of the semiconductor substrate and is a distance of 0.3 µm or more away from the photoelectric conversion portion.

4. The solid-state imaging device according to claim 1, wherein a bias voltage is applied to the site to suppress a dark current.

5. The solid-state imaging device according to claim 1, wherein the site is provided on an outer peripheral portion of the imaging area.

6. The solid-state imaging device according to claim 1, wherein the site comprises carbon ions or phosphorous ions at a predetermined depth in the stacked structure.

7. The solid-state imaging device according to claim 6, wherein the stacked structure has a height of 1 µm or less as measured from the second surface side of the semiconductor substrate.

8. The solid-state imaging device according to claim 1, further comprising:
   a wiring layer provided on the second surface side of the semiconductor substrate, the wiring layer being within the insulating interlayer,
   wherein,
      the site is within the insulating interlayer between the second surface side of the substrate and the metal wiring layer.

9. The solid-state imaging device according to claim 1, wherein the site is a gettering site.

10. The solid-state imaging device according to claim 1, wherein the site is positioned between a first transistor and a second transistor.

* * * * *